(12) United States Patent
Bordelon, Jr.

(10) Patent No.: US 7,388,387 B2
(45) Date of Patent: Jun. 17, 2008

(54) METHOD AND APPARATUS FOR MEASUREMENT OF ELECTRICAL RESISTANCE

(75) Inventor: Terry James Bordelon, Jr., Flower Mound, TX (US)

(73) Assignee: Stratosphere Solutions, Inc., Sunnyvale, CA (US)

( * ) Notice: Subject to any disclaimer, the term of this patent is extended or adjusted under 35 U.S.C. 154(b) by 0 days.

(21) Appl. No.: 11/619,333

(22) Filed: Jan. 3, 2007

(65) Prior Publication Data

US 2007/0164759 A1    Jul. 19, 2007

Related U.S. Application Data

(60) Provisional application No. 60/766,335, filed on Jan. 11, 2006.

(51) Int. Cl.
*G01R 27/08* (2006.01)
*H02M 11/00* (2006.01)
*H03F 3/45* (2006.01)

(52) U.S. Cl. .................... 324/713; 324/691; 327/103

(58) Field of Classification Search ........... 324/713, 324/600, 694; 327/103
See application file for complete search history.

(56) References Cited

U.S. PATENT DOCUMENTS

| | | | |
|---|---|---|---|
| 4,686,487 A * | 8/1987 | Radovsky | 330/288 |
| 5,552,729 A * | 9/1996 | Deguchi | 327/103 |
| 5,936,433 A * | 8/1999 | Holloway | 327/75 |
| 6,013,952 A | 1/2000 | Chan | |
| 6,172,507 B1 | 1/2001 | Hermann | |
| 6,362,638 B1 | 3/2002 | Ashton et al. | |
| 6,795,783 B2 * | 9/2004 | Kotlow et al. | 702/65 |
| 6,927,631 B2 * | 8/2005 | Gupta et al. | 330/260 |
| 6,977,510 B1 * | 12/2005 | Arigliano | 324/549 |
| 2005/0180041 A1 * | 8/2005 | Kajiyama et al. | 360/67 |
| 2005/0261846 A1 * | 11/2005 | Roach | 702/64 |
| 2006/0038605 A1 * | 2/2006 | Pineda De Gyvez et al. | 327/534 |
| 2006/0144165 A1 | 7/2006 | Pietsch et al. | |

\* cited by examiner

*Primary Examiner*—Vincent Q. Nguyen
*Assistant Examiner*—Benjamin M Baldridge
(74) *Attorney, Agent, or Firm*—Schneck & Schneck

(57) ABSTRACT

An electronic circuit and method to determine a resistance value of a resistive element. The circuit includes a current source coupled in series with the resistive element. The current source is configured to force a predetermined value of current through the resistive element and includes a transconducting device coupled to the current source. The transconducting device is configured to sense a voltage across the resistive element and transform the voltage into an output current of the transconducting device such that the output current is not dependent upon any other terminal voltages of the transconducting device.

17 Claims, 5 Drawing Sheets

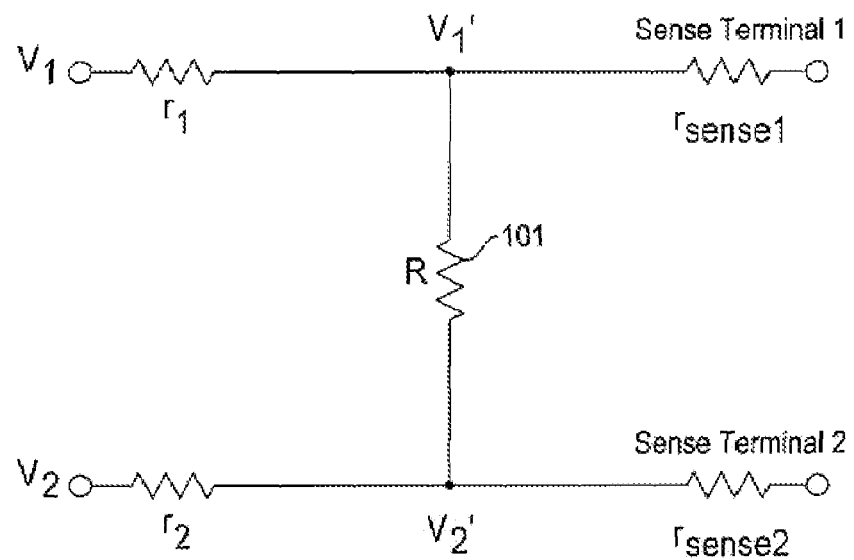
Fig. 1A *(Prior Art)*
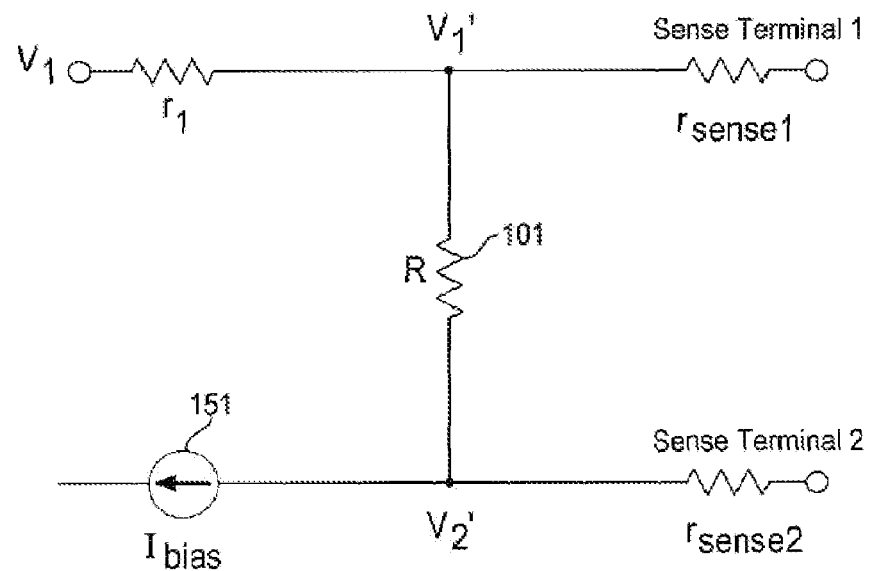
Fig. 1B *(Prior Art)*

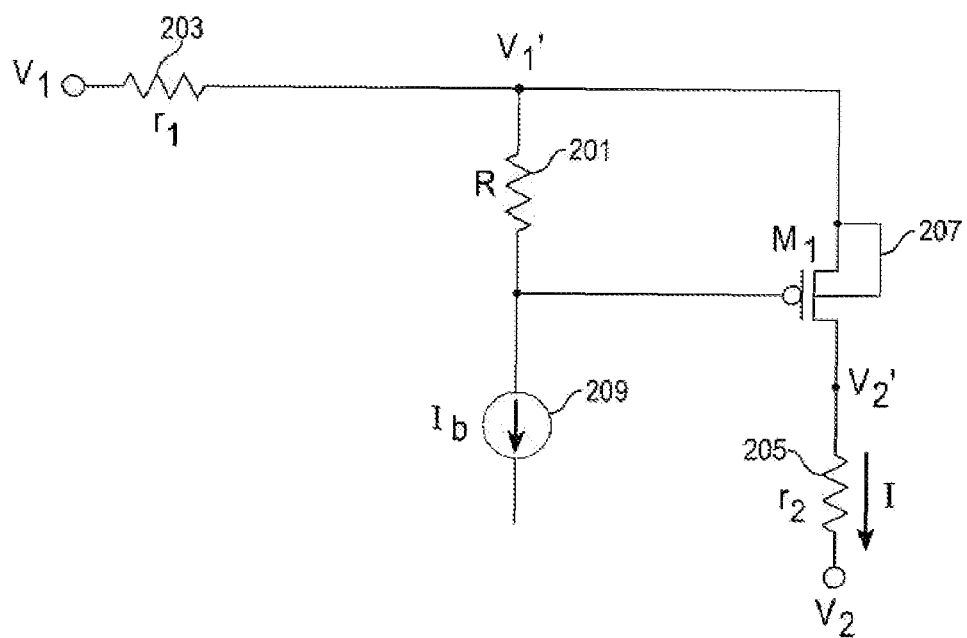
*Fig._ 2*
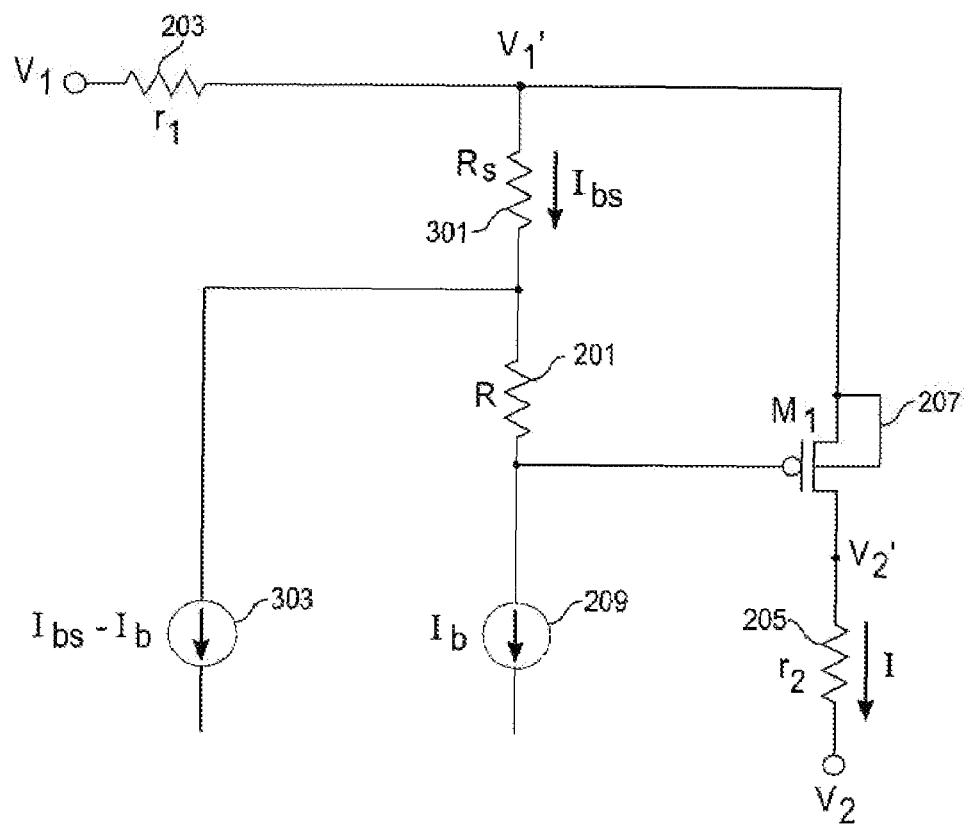
*Fig._ 3*

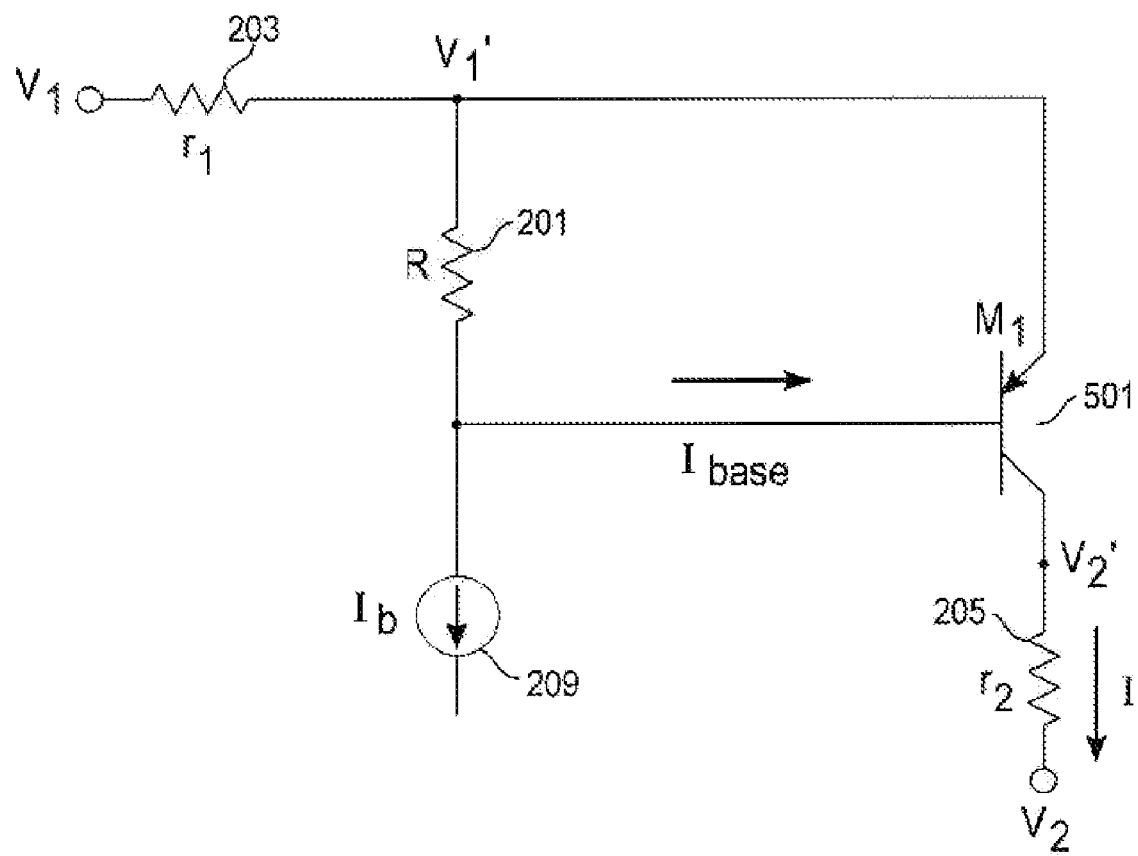
Fig. _ 5

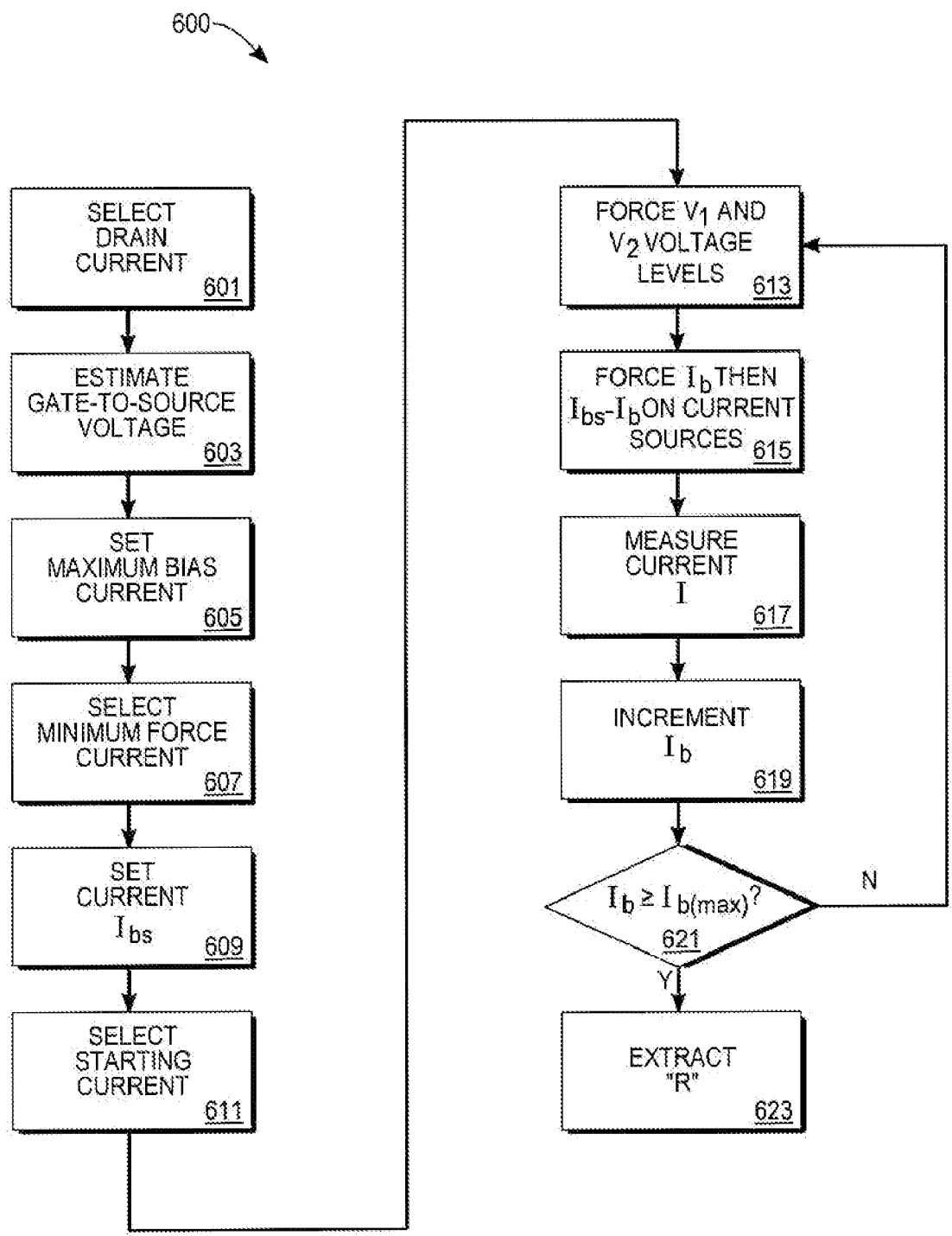
Fig. _ 6

METHOD AND APPARATUS FOR MEASUREMENT OF ELECTRICAL RESISTANCE

CROSS-REFERENCE TO RELATED APPLICATION

This application claims priority from U.S. Provisional Patent Application Ser. No. 60/766,335 entitled "Method and Apparatus for Measurement of Electrical Resistance" filed Jan. 11, 2006 which is hereby incorporated by reference in its entirety.

TECHNICAL FIELD

The present invention is related generally to electronic testing. More specifically, the present invention is related to a method and apparatus for accurate measurements of small resistance values.

BACKGROUND

Common methods to measure an electrical resistance of an electrically conducting element are (1) applying or forcing a known constant voltage across the two terminals comprising the resistive element and measuring the resulting electric current; and (2) forcing a known, constant current through the resistive element and measuring a resulting voltage drop across the element's terminals. The resistance is thus defined as the ratio of voltage to current under static (non-time-varying) conditions.

Any additional unknown resistance (e.g., wiring or switches) in series with the resistive element contributes to the measured resistance, creating a source of error. If the resistance of interest is not much larger than such additional parasitic resistance, then an alternative method is employed which relies on two additional terminals which perform a sensing function (often referred to as a Kelvin method). FIG. 1A illustrates a prior art approach for sensing the resistor terminal voltage when forcing a voltage across the resistive element. FIG. 1B illustrates another prior art approach for sensing the resistor terminal voltage when forcing a current across the resistive element.

In FIG. 1A, the applied voltage difference $V_1-V_2$ induces a current in the test resistor 101 (R) which produces the voltage difference $V_1'-V_2'$. The voltage difference is sensed by forcing a negligible current through each sense terminal (i.e., sense terminals 1 and 2) and measuring a resulting voltage on the sense terminals. The current, I, flowing through either terminal 1 or terminal 2 is measured, and the test resistance determined as $R=(V_1'-V_2')/I$. Since negligible current is passing through parasitic resistances $r_{sense1}$ and $r_{sense2}$, they do not contribute significant error to a determination of the current I. Nor do $r_{sense1}$ and $r_{sense2}$ introduce a significant voltage drop, allowing $V_1'$ and $V_2'$ to be directly associated with voltages measured on their respective sense terminals. In addition, additional parasitic resistances $r_1$ and $r_2$ do not impact the accuracy of the measurement since $V_1'$ and $V_2'$ are sensed directly.

FIG. 1B illustrates a similar configuration differing from FIG. 1A only in that current flowing through a test resistor 151 (R) current is forced directly by a current source 151 ($I=I_{bias}$). In both configurations, the measurement apparatus must measure the voltages $V_1'$ and $V_2'$ in order to determine the resistance of the resistor 101.

In the event that the parasitic resistances $r_1$ and $r_2$ are very large compared with the test resistor 101, accuracy limitations arise. For a given force current ($I_{bias}$), or applied voltage $V_1-V_2$, the voltage drop across the test resistor 101 scales with a proportionality $R/(R+r_1+r_2)$. If the voltage drop across the test resistor 101 becomes sufficiently small, noise-induced voltage fluctuations in the measurement system can cause accuracy degradation and/or long required test times. Test instrumentation can minimize random noise error but at the expense of using time averaging techniques, thereby increasing test time (often considerably). Resistance monitoring applications in a production manufacturing environment may not be able to accommodate a resulting reduction in throughput.

U.S. Pat. No. 6,013,952 to Chan and U.S. Pat. No. 6,362,638 Ashton, et al. each describe an application for measuring the interfacial resistances of integrated circuit films which are representative of the problem described above. However, the small interfacial resistances are measured using a force/sense method which must resolve small voltage drops. Long test times can result to counteract the adverse effects of system noise when measuring small resistances.

Therefore, what is needed is an electrical resistance measurement apparatus and method capable of both accurately measuring small values of resistance and in a time-frame conducive to production environments. The apparatus and method should further be capable of accurately measuring the small resistance value in the presence of series-connected parasitic resistance values that may be orders of magnitude larger than the resistor under test.

SUMMARY OF THE INVENTION

In an exemplary embodiment, the present invention is an electronic circuit to determine a resistance value of a resistive element. The circuit includes a current source coupled in series with the resistive element. The current source is configured to force a predetermined value of current through the resistive element. The circuit further includes a transconducting device coupled to the current source. The transconducting device is configured to sense a voltage across the resistive element and transform the voltage into an output current of the transconducting device such that the output current is not dependent upon any other terminal voltages of the transconducting device.

In another exemplary embodiment, the present invention is an electronic circuit to determine a resistance value of a first resistive element. The circuit includes a first current source coupled in series with the first resistive element and configured to force a first predetermined value of current through the first resistive element. A second resistive element is coupled in series with the first resistive element, thus forming a node. A second current source is coupled to the first current source such that the first resistive element is coupled therebetween. The second current source is further coupled in series with the second resistive element at the node and is configured to force a second predetermined value of current into the node. A transconducting device is coupled both to the first current source and the first and second resistive elements. The transconducting device is configured to sense a first voltage across the first and second resistive elements coupled in series with one another and transform the first voltage into an output current of the transconducting device such that the output current is not dependent upon any other terminal voltages of the transconducting device.

In another exemplary embodiment, the present invention is an electronic circuit to determine a resistance value of a first resistive element. The electronic circuit includes a current source coupled to the resistive element. The current source is configured t force a predetermined value of current through the resistive element. A first transconducting device is coupled to the resistive element and is configured to sense a first voltage difference between a first node of the resistive element and a reference voltage. The first transconducting device is further configured to transform the first voltage difference into a first output current of the first transconducting device such that the first output current is not dependent on any other terminal voltages of the transconducting device. A second transconducting device is coupled to the resistive element and is configured to sense a second voltage difference between a second node of the resistive element and the reference voltage. The second transconducting device is further configured to transform the second voltage difference into a second output current of the second transconducting device such that the second output current is not dependent on any other terminal voltages of the transconducting device.

In another exemplary embodiment, the present invention is a method for determining a value of electrical resistance. The method includes forcing two or more values of known current through a resistor under test to produce two or more voltages generated across the resistor. Each of the two or more voltages generated across the resistor is added to a adjustable constant voltage thereby producing two or more voltage sums. Each of the voltage sums is separately applied to an input of a transconducting device and a current from the transconducting device is generated based on each of the applied voltage sums. The generated current varies exponentially with the applied voltage sum. Each of the values of current generated by the transconducting device is measured at two or more values of the known resistor current. The value of electrical resistance is calculated from the resistor under test from each of the measured values of current generated by the transconducting device at two or more values of the known resistor current.

BRIEF DESCRIPTION OF THE DRAWINGS

FIG. 1A is an electrical resistance measurement circuit of the prior art which operates by forcing a voltage across a resistive element.

FIG. 1B is another electrical resistance measurement circuit of the prior art which operates by forcing a current across a resistive element.

FIG. 2 is an exemplary electrical resistance measurement circuit in accordance with an embodiment of the present invention.

FIG. 3 is an exemplary electrical resistance measurement circuit in accordance with another embodiment of the present invention.

FIG. 5 is an exemplary electrical resistance measurement circuit in accordance with another embodiment of the present invention.

FIG. 6 is an exemplary flowchart indicating an exemplary method in accordance with an embodiment of the present invention.

DETAILED DESCRIPTION

Figure 4A:
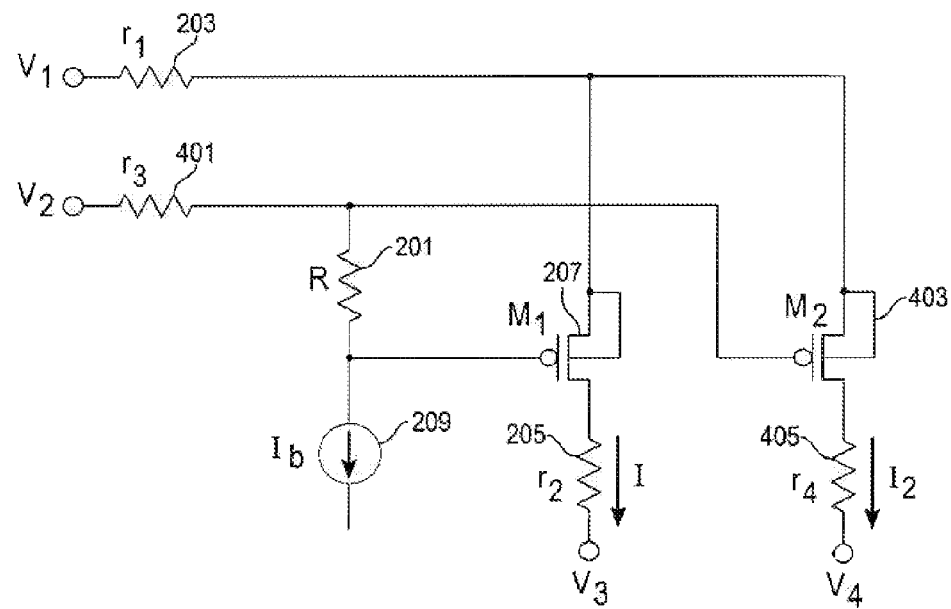
FIG. 4A is an exemplary electrical resistance measurement circuit in accordance with another embodiment of the present invention.

With reference to FIG. 2, an exemplary electrical resistance measurement test circuit includes a resistor under test 201 having a resistance value of R, a first parasitic equivalent resistor 203 having a resistance value of $r_1$, a second parasitic equivalent resistor 205 having a resistance value of $r_2$, a first sensing transistor 207 ($M_1$), and a first current source 209 having a static current, $I_b$. FIG. 2 is instructive for explaining fundamental operating principles common to all embodiments described herein. The resistance value R of the resistor under test 201 is to be measured. The first 203 and second 205 parasitic equivalent resistors account for values of resistance associated with circuit wiring, connectors, and any switches present leading to a measurement instrumentation device (not shown). In a specific exemplary embodiment, the first sensing transistor 207 is a PMOSFET device.

The exemplary electrical resistance measurement test circuit of FIG. 2 is particularly advantageous when a resistance value R of the resistor under test 201 is much smaller than separate or combined resistance values of the first 203 and second 205 parasitic equivalent resistors. In this case, direct measurement of a voltage drop across the resistor under test 201 by a force/sense method (as described above) can become inaccurate and/or time consuming due to the small size of the voltage and its concomitant susceptibility to nose. The exemplary electrical resistance measurement test circuit transforms the resistance R of the resistor under test 201 into a current (I) at terminal $V_2$ which is less susceptible to the accuracy and measurement time limitations of prior art approaches.

In FIG. 2, the first sensing transistor 207 converts a gate-to-source voltage into drain current I. Since the first current source 209 forces a known current $I_b$ through the resistor under test 201, a magnitude of gate-to-source voltage of the first sensing transistor 207 is the product of $I_b$ and R (neglecting any leakage current through the gate of the first sensing transistor 207). The source and drain bias of the first sensing transistor 207, determined by terminals $V_1$ and $V_2$ respectively, is set such that the drain current I is modulated only the gate-to-source voltage. The gate-to-source voltage in turn depends only on $I_b$ and R. This is accomplished by selecting the source voltage $V_1$ and drain voltage $V_2$ of the transistor such that $$V_1' - V_2' >> \frac{kT}{q}$$

and $$(I_b \cdot R) < |V_t|$$

where k is Boltzmann's constant ($1.38099 \times 10^{-23}$ joules/° K), T is temperature (° K), q is the electronic charge ($1.60218 \times 10^{-19}$ coulomb), and $V_t$ is the threshold voltage of the first sensing transistor 207. This biasing arrangement places the first sensing transistor 207 into subthreshold conduction with a sufficiently large drain-to-source voltage such that the drain current I does not depend on the drain-to-source voltage ($V_1'-V_2'$). Thus, the drain current is insensitive to the parasitic resistance $r_2$ on the drain terminal (terminal $V_2$). The drain current is also insensitive to the parasitic resistance $r_1$ of the source terminal (terminal $V_1$) since the drain current does not influence the gate-to-source voltage.

With continued reference to FIG. 2, in subthreshold operation with a sufficiently large drain-to-source voltage, the drain current of the first sensing transistor 207 is given by:

$$I = K \cdot e^{(B \cdot I_b \cdot R)}$$

where B=q/kT and K is a bias-independent prefactor which depends upon the size, threshold voltage, and other parameters of the first sensing transistor 207 which determine the current drive of the first sensing transistor 207.

Differentiating the drain current I with respect to current $I_b$ yields:

$$R = \frac{1}{B}\left(\frac{\partial[\ln(I)]}{\partial[I_b]}\right)$$

Thus, R can be determined by measuring the slope of the natural logarithm of drain current I plotted as a function of the bias current $I_b$ (and scaled by a factor of 1/B). Due to the exponential nature of I as a function of $I_b$, the bias-independent prefactor K need not be known in order to extract the value of R.

The ability to extract the value of R independent of the drain current prefactor K is a significant advantage since the properties of the first sensing transistor 207, or those of another PMOSFET similar to the first sensing transistor 207, would ordinarily need to be measured in order to determine the value of K. If the first sensing transistor 207 itself were to be measured directly to determine K, then another circuit configuration would be needed such that a known voltage could be applied directly to the gate of the first sensing transistor 207. Such a measurement would suffer inaccuracy in the presence of non-negligible parasitic resistances (e.g., $r_1$ and $r_2$), and degrade the accuracy of the method. If a different PMOSFET, similar to the first sensing transistor 207 but connected to the test instrumentation without significant parasitic series resistance, is used to determine K, then any mismatch in the drain current between this device and the first sensing transistor 207 would degrade the accuracy of K and hence the accuracy of the R value extracted.

If both the resistance R and the current $I_b$ are small, then the gate-to-source voltage and the resulting drain current will also be low. FIG. 3 provides a mechanism for adjusting or tuning the magnitude of drain current I once the circuit is constructed, thus providing for an optimally accurate and efficient measurement.

In FIG. 3, another exemplary embodiment includes the circuit of FIG. 2 plus a second resistor 301 having a resistance value of $R_s$ and a second current source 303 providing a static current of $I_{bs}$. The second resistor 301 and the second current source 303 are used to shift the gate-to-source voltage of the first sensing transistor 207 by a fixed amount. The additional constant gate-to-source voltage serves to scale the drain current without changing the sensitivity of the drain current to $I_b$ and R. A constant voltage is created across the second resistor 301 by forcing a constant current through it of value $I_{bs}$. The constant current is accomplished as $I_b$ is varied by forcing a current of value $(I_{bs}-I_b)$ in the second current source 303 (as long as the resistance value, $R_s$, of the second resistor 301 remains constant).

In the event that the first sensing transistor 207 exhibits non-ideal subthreshold conduction, an incremental improvement in accuracy is achieved by describing the first sensing transistor 207 current as $$I = K \cdot e^{[B(I) \cdot I_b \cdot R]}$$

where B now possesses a weak dependence on the drive current I. In this case, the first sensing transistor 207 (or a similar device) must first be measured in a separate test configuration to extract B as a function of I. Then, when I is measured by the present invention, B(I) is readily calculated and analysis can proceed as described above using the value of B(I) previously obtained. Terms containing the derivative of B with respect to I (i.e., $\delta[B(I)]/\delta[I]$) are implicitly ignored in the extraction of R from I in this case but to a good approximation for PMOSFETs exhibiting normal current-voltage characteristics.

With reference to FIG. 4A, a third parasitic equivalent resistor 401 having a resistance value of $r_3$, a fourth parasitic equivalent resistor 405 having a resistance value of $r_4$, and a second sensing transistor 403 ($M_2$) are added and used with an additional terminal $V_1$ to enable adjustment of the gate-to-source voltage of the first sensing transistor 207. In a specific exemplary embodiment, the second sensing transistor 403 is a PMOSFET. The voltage difference ($V_1-V_2$) is added directly to the gate-to-source voltage of the first sensing transistor 207, thereby realizing an ability to tune drain current with the second sensing transistor 403 instead of with the second resistor 301 and the additional current source 303 of the embodiment of FIG. 3. Consequently, one less current source function is needed in the measurement instrumentation utilizing the embodiment of FIG. 4A.

The resistance R is extracted in a manner similar to that described for the exemplary embodiment of FIG. 3, above. Referring again to FIG. 4A, the drain currents of both the first 207 and the second 403 sensing transistors are measured as I and $I_2$, respectively. The first 207 and the second 403 sensing transistors are both biased into subthreshold operation as with the embodiment set forth with reference to FIG. 3. The difference in gate-to-source voltage between the first 207 and the second 403 sensing transistors is $(R \cdot I_b)$. Thus, the ratio of drain currents is $$\frac{I}{I_2} = \frac{K}{K_2} \cdot e^{[B \cdot I_b \cdot R]}$$

with a notation consistent with the equation presented for the embodiment of FIG. 3 and where $K_2$ is the drain current prefactor of the second sensing transistor 403. The resistance is extracted as $$R = \frac{1}{B} \cdot \frac{\partial\left[\ln\left(\frac{I}{I_2}\right) + \ln\left(\frac{K_2}{K}\right)\right]}{\partial[I_b]}$$

$$\Downarrow$$

$$R = \frac{1}{B} \cdot \frac{\partial\left[\ln\left(\frac{I}{I_2}\right)\right]}{\partial[I_b]}$$

in a manner identical to that of the embodiment of FIG. 3 using $I/I_2$ instead of I. Values of K and $K_2$ need not be identical; only their ratio must be independent of $I_b$. The analysis remains valid as long as the first 207 and the second 403 sensing transistors exhibit long channel, bulk device behavior such that their subthreshold slopes are similar.

Figure 4B:
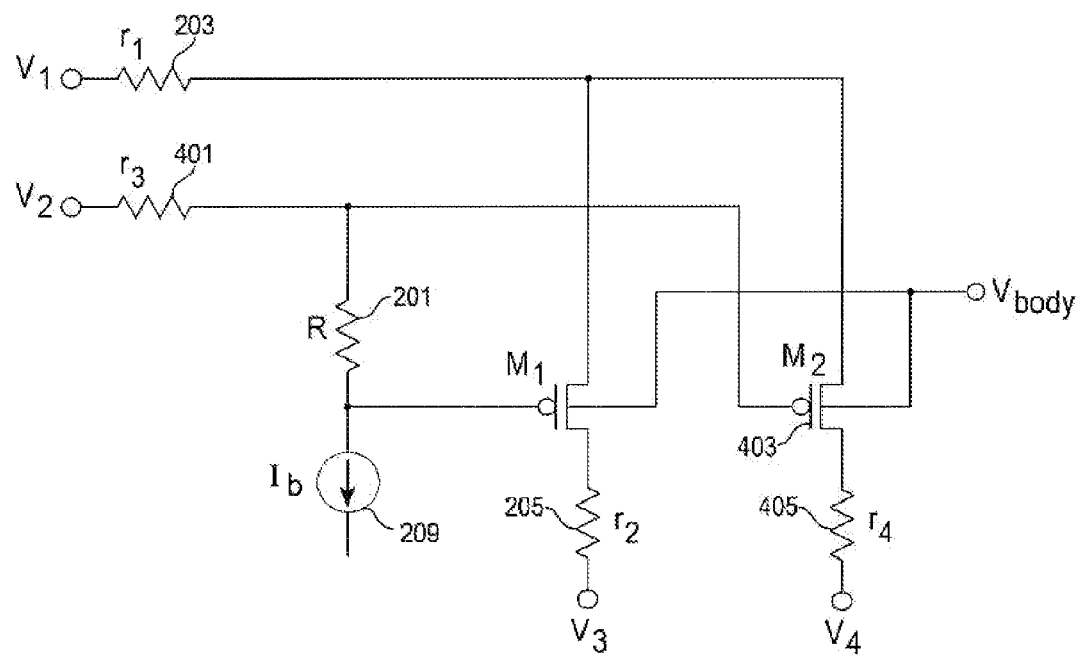
FIG. 4B is a modified version of the exemplary embodiment of FIG. 4A.

FIG. 4B shows an additional feature which may be employed to further adjust circuit functionality. The body of the first 207 and the second 403 sensing transistors may be biased independent of the common transistor source to adjust the threshold voltage of each transistor and hence the drain current. This biasing offers an additional degree of control for optimally scaling the drain current by applying a forward or reverse body bias.

Referring now to FIG. 5, another alternative exemplary embodiment uses a bipolar transistor 501 instead of a MOS- FET (e.g., the first sensing transistor 207, FIG. 2). In a specific exemplary embodiment, the bipolar transistor 501 is a PNP transistor. The bipolar transistor 501 is biased into forward active mode where the collector current exhibits a similar exponential dependence on the base-to-emitter voltage. If the emitter-to-collector voltage is much larger than kT/q, then the collector current depends on the base-emitter voltage as $$I = K \cdot e^{[B \cdot R \cdot (I_b - I_{base})]}$$

where K is a bias-independent prefactor. Unlike the MOSFET in subthreshold conduction, there is a base current in the bipolar transistor 501 which may be comparable in magnitude to the collector current (if the forward gain of the bipolar device is near unity). If $I_{base} \ll I_b$, however, then the bipolar transistor 501 in forward active mode allows the same extraction of resistance R as that employed with the MOSFET in subthreshold conduction, namely:

$$R = \frac{1}{B} \cdot \left( \frac{\partial [\ln(I)]}{\partial [I_b]} \right)$$

Any error incurred due to $I_{base}$ is simply $$\frac{R(\text{measured})}{R(\text{actual})} = 1 - \frac{I_{base}}{I_b}$$

In many applications, $I_{base}$ may be two to three orders of magnitude smaller than $I_b$.

Method for Electrical Resistance Measurement

Various embodiments of the present invention may be used by applying suitable voltages and currents to the circuit terminals and measuring the resulting drain current I. The resistance R is then calculated by methods described above. Current sources may be implemented as connections directly to external measurement apparatus, or to current mirror circuitry with suitable biasing and control inputs. One exemplary method of operation is described immediately below. Note that the method is exemplary only but a person of ordinary skill in the art would recognize certain modification that would still be within a scope of the present invention. Therefore, embodiments of the invention may be operated in a manner differing from the following sequence, but preserving conditions for proper operation as described above.

Referring now to FIG. 6 and referring back to FIG. 3, an exemplary flowchart 600 presents a method of measuring electrical resistance utilizing one of the various circuit embodiments described herein. A skilled artisan will recognize which values may need substitution based on, for example, the type of transistor selected in the measurement circuit.

Initially, a user will select 601 the magnitude desired for drain current I based on accuracy considerations and any limitations of the test hardware. A value of gate-to-source voltage is estimated 603 that is needed to achieve the desired magnitude of I based on an approximate knowledge of transistor M1 properties. A maximum value for bias current $I_b$ is set 605 based on (a) a desired gate-to-source voltage ($V_{gs}$) obtained from the preceding step 603, and (b) an approximate value of the resistor R and the relation $I_b(\text{max}) = V_{gs}/R$.

A value of the minimum force current ($I_{min}$) is selected 607 such that the value is greater than the leakage current floor of the measurement apparatus and test environment. The current $I_{bs}$ is set 609 such that $I_{bs} = I_{min} + I_b(\text{max})$. A value for starting current is selected 611 such that $I_b > I_{min}$. Voltages for $V_1$ and $V_2$ are forced 613 such that $V_1 = V_{dd}$ and $V_2 = 0$, where $V_{dd}$ is the maximum (supply) voltage. Current values are forced 615 sequentially; $I_b$ then $I_{bs} - I_b$ on the first 209 and second 303 current sources, respectively (FIG. 3). Current is then measured 617 on terminal $V_2$.

The value of $I_b$ is then incremented 619. A determination 621 is made whether $I_b \geq I_b(\text{max})$. If $I_b < I_b(\text{max})$, steps 613-619 are repeated until $I_b \geq I_b(\text{max})$. Finally, the resistance value R may be extracted directly in accordance with the governing equations discussed above where R is the slope of ln[I]/B plotted against $I_b$ (B=q/kT or B(I)).

Steps 601-611 may be applied during the circuit design phase so that the value of resistor $R_s$ is selected as $$R_s = \frac{V_{gs} - (R_{est} \cdot I_b(\text{max}))}{I_{bs}}$$

where $R_{est}$ is an estimate of the value of resistor R.

Advantages of Embodiments of the Invention over Prior Art

Numerous advantages are realized from descriptions of the present invention set forth herein coupled with any modifications to embodiments of the invention recognizable by a skilled artisan. Among these advantages, the embodiments of the invention allows accurate measurement of a small resistance in series with much larger unknown parasitic resistances. The small resistance is accurately measured by sensing an electrical current on a terminal whose voltage does not need to be known. The magnitude of the sensed current is adjustable to a range suited for optimal measurement accuracy. A voltage measurement is not needed as required by the prior art, thus eliminating accuracy limitations due to voltage noise when measuring small voltage differences characteristic of small test resistances. Further, the accuracy of the sense current is not dependent on the size of parasitic series resistances nor is the accuracy of the sense current dependent on the current drive strength of constituent transistors of the sense circuit. Since neither the size of parasitic series resistances nor the current drive strength of constituent transistors are required for measurement, characterization of interconnect wiring and sense circuit devices is not needed. Consequently, the accuracy of extracted resistance is dependent only on the consistency of the exponential nature of the test circuit transistor current under appropriate bias conditions.

Various embodiments of the invention provide a method and circuit apparatus for accurately extracting the value of a small test resistance in the presence of large, unknown parasitic resistances in series with the test resistance. Such a scenario is commonly encountered in characterizing the performance of integrated circuit elements, where interconnect resistance and switch resistances can be relatively very large. The invention thus avoids disadvantages of commonly used force/sense (Kelvin) methods such as voltage noise susceptibility and sense leakage current error. The invention effectively transforms the test resistance into a current which can be scaled well above circuit leakage levels and into a range best suited for the measurement instrumentation. As a result, faster and more accurate measurements of small resistance are possible i the presence of parasitic resistances and measurement system noise. Fabricated as an integrated circuit embodiments of the invention allow much a greater density of resistor test structures than traditional force/sense test structures. Area-efficient multiplexing techniques which introduce series resistance and leakage current can be utilized without degrading the accuracy of small resistance measurements.

In the foregoing specification, the present invention has been described with reference to specific embodiments thereof. It will, however, be evident to a skilled artisan that various modifications and changes can be made thereto without departing from the broader spirit and scope of the preset invention as set forth in the appended claims. For example, all embodiments described utilize 'p-type' transistor elements. Each embodiment can be readily transformed into a version which uses 'n-type' transistor elements in a straightforward manner apparent to one skilled in the art of basic transistor circuit design. A scope of the present invention covers such cases which are constructed through simple polarity reversal of voltages and currents, thereby retaining the same claims as the invention embodiments described in detail. Further, other non-linear control devices besides those shown can be used to realize basic non-linear behavior in the circuitry. Additionally, a skilled artisan will recognize that various types of transistor technology may be employed for the various embodiments described herein. These other technologies include, for example, BiCMOS, DMOS, or other transconducting device circuitry. These technologies may be implemented in, for example, silicon or other elemental semiconductors, Group III-V or II-VI compound semiconductors, and various alloys thereof or various substrate types such as silicon-on-insulator or even non-standard substrates such as a polyethyleneterephthalate (PET) substrate deposited with silicon dioxide and polysilicon followed by an excimer laser annealing (ELA) anneal step. Each of these technology types and materials are recognizable to a skilled artisan. These and various other embodiments are all within a scope of the present invention. The specification and drawings are, accordingly, to be regarded in an illustrative rather than a restrictive sense.

What is claimed is:

1. An electronic circuit to determine a resistance value of a resistive element, the circuit comprising:
    a current source coupled in series with the resistive element, the current source configured to force a predetermined value of current through the resistive element; and
    a transconducting device coupled to the current source and configured to sense a voltage across the resistive element while not receiving any forced current from the current source, the transconducting device further configured to transform the voltage into an output current of the transconducting device, the output current not being dependent upon any other terminal voltages of the transconducting device.

2. The electronic circuit of claim 1 wherein the transconducting device is a transistor.

3. The electronic circuit of claim 2 wherein the transistor is a PMOSFET device.

4. An electronic circuit to determine a resistance value of a first resistive element, the circuit comprising:
    a first current source coupled in series with the first resistive element, the first current source configured to force a first predetermined value of current through the first resistive element;
    a second resistive element coupled in series with the first resistive element and forming a node;
    a second current source coupled to the first current source such that the first resistive element is coupled therebetween, the second current source further coupled in series with the second resistive element at the node, the second current source configured to force a second predetermined value of current into the node and modulate a bias condition of the electronic circuit; and
    a transconducting device coupled to both the first current source and the first and second resistive elements, the transconducting device configured to sense a first voltage across the first and second resistive elements coupled in series with one another, the transconducting device further configured to transform the first voltage into an output current of the transconducting device, the output current not being dependent upon any other terminal voltages of the transconducting device.

5. The electronic circuit of claim 4 wherein a magnitude of the second predetermined value of current supplied by the second current source is established such that a second voltage generated across the second resistive element is constant.

6. The electronic circuit of claim 4 wherein the transconducting device is a transistor.

7. The electronic circuit of claim 6 wherein the transistor is a PMOSFET device.

8. The electronic circuit of claim 7 wherein the second resistive element is configured to shift a gate-to-source voltage of the PMOSFET device by a fixed amount.

9. An electronic circuit to determine a resistance value of a resistive element, the circuit comprising:
    a current source coupled to the resistive element, the current source configured to force a predetermined value of current through the resistive element;
    a first transconducting device coupled to the resistive element, the first transconducting device configured to sense a first voltage difference between a first node of the resistive element and a reference voltage, the first transconducting device further configured to transform the first voltage difference into a first output current of the first transconducting device such that the first output current is not dependent upon any other terminal voltages of the transconducting device; and
    a second transconducting device coupled to the resistive element, the second transconducting device configured to sense a second voltage difference between a second node of the resistive element and the reference voltage, the second transconducting device further configured to transform the second voltage difference into a second output current of the second transconducting device such that the second output current is not dependent upon any other terminal voltages of the transconducting device.

10. The electronic circuit of claim 9 wherein the reference voltage is established to be adjustable in magnitude thereby setting a magnitude of the first and second output currents.

11. The electronic circuit of claim 9 wherein the first and second transconducting devices are each a transistor.

12. The electronic circuit of claim 11 wherein the transistors are comprised of PMOSFET devices.

13. A method for determining a value of electrical resistance, the method comprising:
    forcing two or more values of known current through a resistor under test to produce two or more voltages generated across the resistor;
    adding each of the two or more voltages generated across the resistor to an adjustable constant voltage, thereby producing two or more voltage sums;
    separately applying each of the voltage sums to an input of a transconducting device;

generating a current from the transconducting device based on each of the applied voltage sums, the generated current varying exponentially with the applied voltage sum;

measuring each of the values of current generated by the transconducting device at two or more values of the known resistor current; and calculating the value of electrical resistance from the resistor under test from each of the measured values of current generated by the transconducting device at two or more values of the known resistor current.

14. The method of claim 13 wherein calculating the value of electrical resistance includes determining a difference in the measured values of output current.

15. The method of claim 13 wherein calculating the value of electrical resistance further includes scaling each of the measured values of current.

16. The method of claim 13 wherein calculating the value of electrical resistance is independent of an absolute magnitude of any of the values of generated transconducting device current.

17. The method of claim 13 further comprising selecting a transconducting device that has an exponential transfer function of applied voltage to generated current.

* * * * *

UNITED STATES PATENT AND TRADEMARK OFFICE
CERTIFICATE OF CORRECTION

| | | |
|---|---|---|
| PATENT NO. | : 7,388,387 B2 | Page 1 of 1 |
| APPLICATION NO. | : 11/619333 | |
| DATED | : June 17, 2008 | |
| INVENTOR(S) | : Terry James Bordelon, Jr. | |

It is certified that error appears in the above-identified patent and that said Letters Patent is hereby corrected as shown below:

Column 3, lines 21-22 "... two or more voltages generated ac ross the resistor. ..." should read --... two or more voltages generated across the resistor. ...--.

Column 3, lines 62-64 "... configured t force a predetermined ..." should read --configured to force a predetermined ...--.

Column 8, lines 62-63 "... small resistance are possible i the presence of ..." should read --... small resistance are possible in the presence of ...--.

Column 9, lines 7-8 "... broader spirit and scope of the preset invention as ..." should read --... broader spirit and scope of the present invention as--.

Signed and Sealed this

Thirty-first Day of March, 2009

JOHN DOLL
*Acting Director of the United States Patent and Trademark Office*